(12) United States Patent
Li et al.

(10) Patent No.: US 10,509,163 B2
(45) Date of Patent: Dec. 17, 2019

(54) HIGH-SPEED OPTICAL TRANSMITTER WITH A SILICON SUBSTRATE

(71) Applicant: Skorpios Technologies, Inc., Albuquerque, NM (US)

(72) Inventors: Guoliang Li, Albuquerque, NM (US); Stephen B. Krasulick, Albuquerque, NM (US); Samir Desai, Rancho Santa Margarita, CA (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 15/426,823

(22) Filed: Feb. 7, 2017

(65) Prior Publication Data
US 2017/0230117 A1    Aug. 10, 2017

Related U.S. Application Data

(60) Provisional application No. 62/292,633, filed on Feb. 8, 2016, provisional application No. 62/292,675, filed
(Continued)

(51) Int. Cl.
*G02B 6/12* (2006.01)
*H04B 10/50* (2013.01)
(Continued)

(52) U.S. Cl.
CPC ......... *G02B 6/12002* (2013.01); *G02B 6/122* (2013.01); *G02B 6/12004* (2013.01); *G02B 6/136* (2013.01); *H01S 5/0202* (2013.01); *H01S 5/028* (2013.01); *H01S 5/02252* (2013.01); *H01S 5/22* (2013.01); *H01S 5/3013* (2013.01); *H01S 5/343* (2013.01); *H01S 5/4025* (2013.01); *H01S 5/4087* (2013.01); *H04B 10/505* (2013.01); *H04J 14/02* (2013.01);
(Continued)

(58) Field of Classification Search
CPC . H04B 10/505; H04B 10/506; G02B 6/12002
See application file for complete search history.

(56) References Cited

U.S. PATENT DOCUMENTS 3,894,789 A    7/1975   Kobayashi
5,780,875 A    7/1998   Tsuji et al.
(Continued)

FOREIGN PATENT DOCUMENTS

WO    2014-083507 A2    6/2014
WO    2015-054491 A2    4/2015

OTHER PUBLICATIONS

International Search Report and Written Opinion dated Apr. 25, 2017 for International Patent Application No. PCT/US2017/016968; all pages.
(Continued)

*Primary Examiner* — Nathan M Cors
(74) *Attorney, Agent, or Firm* — Kilpatrick Townsend & Stockton LLP

(57) ABSTRACT

A 400 Gb/s transmitter is integrated on a silicon substrate. The transmitter uses four gain chips, sixteen lasers, four modulators to modulate the sixteen lasers at 25 Gb/s, and four multiplexers to produce four optical outputs. Each optical output can transmit at 100 Gb/s to produce a 400 Gb/s transmitter. Other variations are also described.

6 Claims, 5 Drawing Sheets

Related U.S. Application Data on Feb. 8, 2016, provisional application No. 62/292,636, filed on Feb. 8, 2016.

(51) Int. Cl.

| | |
|---|---|
| *H01S 5/022* | (2006.01) |
| *G02B 6/122* | (2006.01) |
| *G02B 6/136* | (2006.01) |
| *H01S 5/02* | (2006.01) |
| *H01S 5/028* | (2006.01) |
| *H01S 5/22* | (2006.01) |
| *H01S 5/343* | (2006.01) |
| *H01S 5/40* | (2006.01) |
| *H01S 5/30* | (2006.01) |
| *H04J 14/02* | (2006.01) |
| *H01S 5/026* | (2006.01) |

(52) U.S. Cl.
CPC ............. *G02B 6/12007* (2013.01); *G02B 2006/12061* (2013.01); *G02B 2006/12104* (2013.01); *G02B 2006/12121* (2013.01); *G02B 2006/12142* (2013.01); *G02B 2006/12147* (2013.01); *H01S 5/021* (2013.01); *H01S 5/026* (2013.01)

(56) References Cited

U.S. PATENT DOCUMENTS

| | | | |
|---|---|---|---|
| 6,259,841 B1 | 7/2001 | Bhagavatula | |
| 6,393,171 B2 | 5/2002 | Sasaki et al. | |
| 6,888,984 B2 | 5/2005 | Abeles | |
| 7,359,593 B2 | 4/2008 | Little | |
| 7,470,069 B1 | 12/2008 | Offrein et al. | |
| 7,805,037 B1 | 9/2010 | Van Der Vliet et al. | |
| 8,064,493 B2 | 12/2011 | Behfar et al. | |
| 8,463,088 B1 | 6/2013 | Asghari et al. | |
| 8,755,650 B2 | 6/2014 | Peng | |
| 9,048,958 B2 | 6/2015 | Chaahoub et al. | |
| 9,097,846 B2 | 8/2015 | Mizrahi | |
| 2003/0034538 A1 | 2/2003 | Brophy et al. | |
| 2003/0044118 A1 | 3/2003 | Zhou | |
| 2003/0165293 A1 | 9/2003 | Abeles | |
| 2005/0117844 A1 | 6/2005 | Abeles | |
| 2005/0123244 A1 | 6/2005 | Block | |
| 2005/0202554 A1 | 9/2005 | Luo | |
| 2006/0104322 A1 | 5/2006 | Park | |
| 2006/0115215 A1 | 6/2006 | Liu | |
| 2006/0210215 A1 | 9/2006 | Aoki et al. | |
| 2006/0285797 A1 | 12/2006 | Little | |
| 2007/0116410 A1 | 5/2007 | Kwakernaak | |
| 2007/0147761 A1 | 6/2007 | Kwakernaak | |
| 2007/0242919 A1* | 10/2007 | Welch .................... | B82Y 20/00 385/14 |
| 2008/0180340 A1 | 7/2008 | Hobbs | |
| 2009/0303579 A1 | 12/2009 | Winterberg | |
| 2010/0040327 A1 | 2/2010 | Deki | |
| 2010/0213467 A1 | 8/2010 | Lee et al. | |
| 2010/0284019 A1 | 11/2010 | Fukuda | |
| 2010/0284698 A1 | 11/2010 | McColloch | |
| 2010/0303469 A1 | 12/2010 | Barton et al. | |
| 2011/0085572 A1 | 4/2011 | Dallesasse | |
| 2011/0205660 A1 | 8/2011 | Komura | |
| 2011/0280579 A1 | 11/2011 | McLaren et al. | |
| 2013/0039664 A1 | 2/2013 | Clifton et al. | |
| 2013/0051727 A1 | 2/2013 | Mizrahi et al. | |
| 2013/0064514 A1 | 3/2013 | Peng | |
| 2013/0230272 A1 | 9/2013 | Raj et al. | |
| 2014/0029951 A1* | 1/2014 | Handelman ............. | H04J 14/02 398/91 |
| 2014/0177222 A1 | 6/2014 | Barwicz et al. | |
| 2014/0185980 A1 | 7/2014 | Lei et al. | |
| 2014/0342479 A1* | 11/2014 | Marchena ......... | H01L 21/76251 438/26 |
| 2014/0352759 A1 | 12/2014 | Barnes | |
| 2015/0097210 A1 | 4/2015 | Krasulick | |
| 2015/0098676 A1* | 4/2015 | Krasulick ............. | G02B 6/1225 385/14 |
| 2015/0099318 A1 | 4/2015 | Krasulick | |
| 2015/0123157 A1 | 5/2015 | Dallesasse et al. | |
| 2015/0177458 A1 | 6/2015 | Bowers et al. | |
| 2015/0249501 A1* | 9/2015 | Nagarajan ............... | H04J 14/02 398/79 |
| 2015/0255952 A1 | 9/2015 | Chaouch et al. | |
| 2015/0260913 A1 | 9/2015 | Li et al. | |
| 2015/0341123 A1 | 11/2015 | Nagarajan | |
| 2016/0301191 A1* | 10/2016 | Orcutt ................ | H04B 10/5053 |

OTHER PUBLICATIONS

International Search Report and Written Opinion dated Apr. 25, 2017 for International Patent Application No. PCT/US2017/016958; all pages.

Cherchi, et al.; "Dramatic size reduction of waveguide bends on a micron-scale silicon photonic platform"; *Optics Express*, Jul. 29, 2013; vol. 21, No. 15; DOI:10.1364/OE.21.017814; all pages.

Lambert; "Broadband Back Mirror fora III-V Chip in Silicon Photonics"; U.S. Appl. No. 15/426,375, filed Feb. 7, 2017.

Lambert; "Stepped Optical Bridge for Connecting Semiconductor Waveguides"; U.S. Appl. No. 15/426,366, filed Feb. 7, 2017.

PCT/US2017/016958 received an International Preliminary Report on Patentability, dated Aug. 23, 2018, 9 pages.

U.S. Appl. No. 15/426,375 received a Non-Final Office Action dated Dec. 14, 2018, 15 pages.

EP17750673.0 received a Partial Supplementary European Search Report dated Oct. 7, 2019, 13 pages.

* cited by examiner

HIGH-SPEED OPTICAL TRANSMITTER WITH A SILICON SUBSTRATE

CROSS-REFERENCES TO RELATED APPLICATIONS

This application claims priority to U.S. Provisional Application No. 62/292,633, filed on Feb. 8, 2016, entitled "High-Speed Optical Transmitter with a Silicon Substrate," U.S. Provisional Application No. 62/292,675, filed on Feb. 8, 2016, entitled "Stepped Optical Bridge for Connecting Semiconductor Waveguides," and U.S. Provisional Application No. 62/292,636, filed on Feb. 8, 2016, entitled "Broadband Back Mirror for a III-V Chip in Silicon Photonics," the disclosures of which are incorporated by reference for all purposes.

The following three U.S. patent applications (including this one) are being filed concurrently, and the entire disclosure of the other applications are incorporated by reference into this application for all purposes:

application Ser. No. 15/426,823, filed Feb. 7, 2017, entitled "High-Speed Optical Transmitter with a Silicon Substrate";

application Ser. No. 15/426,366, filed Feb. 7, 2017, entitled "Stepped Optical Bridge for Connecting Semiconductor Waveguides"; and application Ser. No. 15/426,375, filed Feb. 7, 2017, entitled "Broadband Back Mirror for a III-V Chip in Silicon Photonics."

BACKGROUND OF THE INVENTION

Silicon integrated circuits ("ICs") have dominated the development of electronics and many technologies based upon silicon processing have been developed over the years. Their continued refinement led to nano-scale feature sizes that can be important for making metal oxide semiconductor CMOS circuits. On the other hand, silicon is not a direct-bandgap material. Although direct-bandgap materials, including III-V semiconductor materials, have been developed, there is a need in the art for improved methods and systems related to photonic ICs utilizing silicon substrates. This application relates to optical transmitters and optical waveguides. More specifically, and without limitation, to optical lasers and/or optical waveguides in silicon.

BRIEF SUMMARY OF THE INVENTION

Embodiments for a 400 Gb/s transmitter are disclosed. Example embodiments include:
  Example 1: A single optical output having sixteen different wavelengths, each wavelength transmitting at 25 Gb/s (1×16λ×25 G).
  Example 2: Four optical outputs, each optical output having four different wavelengths, each transmitting at 25 Gb/s (4×4λ×25 G).
  Example 3: A single optical output having eight different wavelengths, each transmitting at 50 Gb/s (1×8λ×50 G).
  Example 4: A single optical output having four different wavelengths, each transmitting at 100 Gb/s (1×4λ×100 G).
In some embodiments, example 1, example 2, example 3, and example 4, each have four chips for lasers and/or four chips for modulators. In some embodiments, multiple waveguides per chip are used to reduce a number of chips used in a transmitter.

In some embodiments, a semiconductor chip comprises a first ridge and a second ridge; the first ridge is configured to guide a first optical mode in the semiconductor chip; the second ridge is configured to guide a second optical mode in the semiconductor chip. In some embodiments, the first optical mode is generated by a first laser; the second optical mode is generated by a second laser; and/or the semiconductor chip is a gain chip or a modulator chip.

In some embodiments, an optical transmitter using semiconductor lasers and wavelength-division multiplexing (WDM) comprises a substrate, four gain chips integrated on the substrate, a plurality of reflectors integrated on the substrate, four modulator chips integrated on the substrate, sixteen waveguides integrated on the substrate, four multiplexers integrated on the substrate, and four optical outputs integrated on the substrate, wherein: the substrate is silicon; the four gain chips and the plurality of reflectors form a plurality of lasers integrated on the substrate; the plurality of lasers are configured to transmit on predetermined optical channels of a WDM protocol; the four modulator chips modulate light generated by the plurality of lasers; the sixteen waveguides are configured to guide light from the four modulator chips to the four multiplexers; each of the four multiplexers is configured to receive light from four waveguides of the sixteen waveguides and combine the light from the four waveguides into an optical output of the four optical outputs; there is one optical output for each of the four multiplexers; and/or each of the four optical outputs is configured to transmit light of four different frequencies to an optical fiber. In some embodiments, there are four lasers per gain chip, and each laser per gain chip operates on the same predetermined optical channel of the WDM protocol; each gain chip, of the four gain chips, has a different bandgap; there is one laser per gain chip, and each modulator chip has four ridges to produce four modulated signals; the four gain chips comprise III-V material; the substrate is part of a silicon-on-insulator (SOI) wafer, the SOI wafer comprises a device layer of crystalline silicon, and the sixteen waveguides are formed in the device layer; and/or each of the modulator chips modulate each of the plurality of lasers to produce a plurality an optical beams, each optical beam of the plurality of optical beams modulated at 25 Gb/s plus or minus 20%.

In some embodiments, an optical transmitter comprises a substrate, a plurality of gain chips integrated on the substrate, a plurality of reflectors integrated on the substrate, a plurality of modulator chips integrated on the substrate, a plurality of waveguides integrated on the substrate, and one or more multiplexers integrated on the substrate, wherein: the substrate is silicon; the plurality of gain chips and the plurality of reflectors form a plurality of lasers; the plurality of modulator chips modulate light from the plurality of lasers; the plurality of waveguides guide light from the plurality of modulators to one or more multiplexers; and/or the one or more multiplexers combine light from the plurality of waveguides into one or more optical outputs. In some embodiments, the plurality of gain chips comprise four gain chips, the plurality of modulator chips comprise four modulator chips, and the plurality of waveguides comprise four waveguides; the plurality of waveguides comprise sixteen waveguides, the one or more multiplexers comprise four multiplexers, and the one or more optical outputs comprise four optical outputs; the one or more multiplexers is one multiplexer, the plurality of waveguides comprises sixteen waveguides coupled with the one multiplexer, and the one or more optical outputs is one optical output; the optical channels are spaced using a 20 nm channel spacing plus or minus 30%; the optical channels are spaced using a channel spacing between 3.5 nm and 13 nm; each gain chip, of the plurality of gain chips, has a different bandgap; the plurality of modulator chips are configured to modulate light from the plurality of lasers using a pulse-amplitude modulation (PAM) technique having more than two levels; each gain chip, of the plurality of gain chips, comprise III-V material, the substrate is part of a silicon-on-insulator (SOI) wafer, the SOI wafer comprises a device layer of crystalline silicon, each waveguide, of the plurality of waveguides, is formed in the device layer of the SOI wafer, and the one or more multiplexers are formed in the device layer of the SOI wafer.

In some embodiments, a method of operating an optical transmitter comprises: generating a plurality of laser beams using a plurality of lasers integrated on a substrate, wherein generating the plurality laser beams comprises applying electrical power to a plurality of gain chips; modulating the plurality of laser beams using a plurality of modulator chips to form a plurality of modulated beams; guiding the plurality of modulated beams to one or more multiplexers using a plurality of waveguides; and combining the plurality of modulated beams into one or more output beams using the one or more multiplexers. In some embodiments, modulating the plurality of laser beams comprises using a pulse-amplitude modulation (PAM) technique having more than two levels; the pulse-amplitude modulation technique is PAM4; modulating the plurality of laser beams comprises modulating each laser beam of the plurality of laser beams to transmit at 25 Gb/s plus or minus 20%; and/or a combined transmission rate of the one or more output beams is 400 Gb/s plus or minus 20%.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The present disclosure is described in conjunction with the appended figures.

Figure 1:
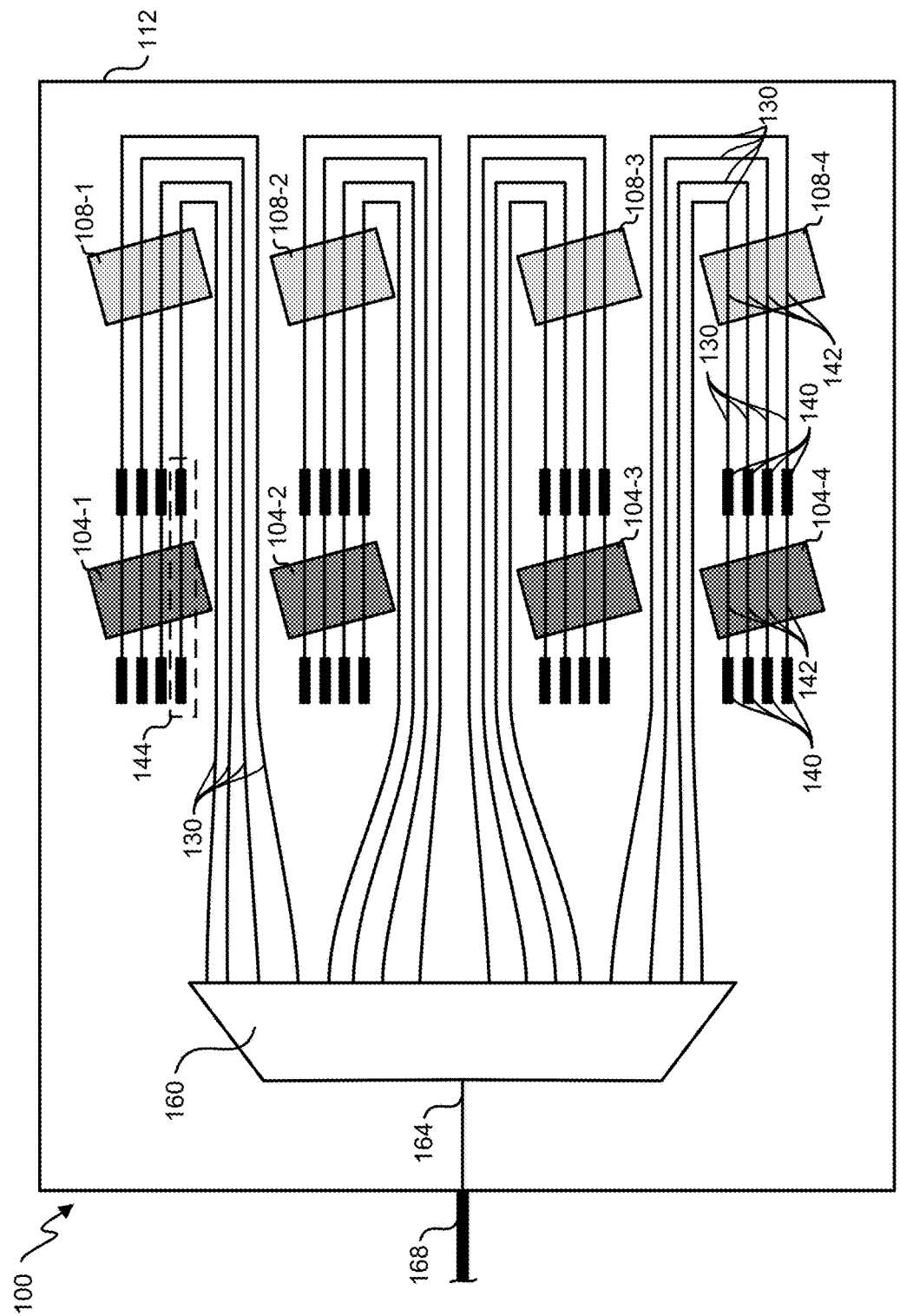
FIG. 1 depicts a simplified top view of an embodiment of a sixteen-wavelength transmitter.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The ensuing description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Embodiments generally relate to an optical transmitter having a silicon platform. In some embodiments, the optical transmitter provides 400 Gb/s transmission. A chip is bonded to a platform. In some embodiments, the chip is made of III-V material and the platform is a silicon-on-insulator (SOI) wafer. In some embodiments, bonding is used as described in U.S. application Ser. No. 14/509,914, filed on Oct. 8, 2014, which is incorporated by reference. In some embodiments, chips are bonded into recesses of the platform. In some embodiments, chips are formed from epitaxial layers of compound semiconductor material (e.g., III-V materials). In some embodiments, chips are used to perform functions that are difficult for silicon to perform (e.g., a chip with a direct bandgap is used as a gain medium or a modulator for a laser; silicon has an indirect bandgap making silicon a poor optical emitter). An example of a tunable laser using a chip for a gain medium, and reflectors in silicon, is given in U.S. application Ser. No. 14/642,443, filed on Mar. 9, 2015, which is incorporated by reference. In some embodiments, chips are formed by dicing a semiconductor wafer and/or bonding the chips to the substrate using template assisted bonding, such as described in U.S. application Ser. No. 14/261,276, filed on Apr. 24, 2014, and U.S. application Ser. No. 14/482,650, filed on Sep. 10, 2014, which are incorporated by reference. In some embodiments, thick silicon is used to more efficiently couple (e.g., butt couple) waveguides in silicon with waveguides in chips. In some embodiments, thick silicon is between 0.7 μm and 5 μm, or from 1 μm to 2.5 μm. In some embodiments, multiple ridges/lasers per chip are used to reduce a number of chips used in a transmitter. Reducing the number of chips improves fabrication yield and cost. In some embodiments, reducing the number of chips is accomplished without significant penalty to performance and/or wavelength tuning. In some embodiments, ridges on one chip channel light of different frequencies.

Referring first to FIG. 1, a simplified top view of an embodiment of a sixteen-wavelength transmitter 100 (a first transmitter) is shown. The sixteen-wavelength transmitter 100 transmits at 400 Gb/s by having sixteen lasers of different frequencies, each laser modulated at 25 Gb/s. Gain chips 104 and modulator chips 108 are bonded to a substrate 112 (e.g., of silicon). In some embodiments, the substrate 112 is part of a silicon-on-insulator (SOI) wafer. The SOI wafer comprising the substrate 112 (which is crystalline silicon), an insulating layer (e.g., SiO2), and a device layer (e.g., crystalline silicon). In some embodiments, bonding as described in the '914 application is used to bond the gain chips 104 and/or the modulator chips 108 to the substrate 112. Four gain chips 104 are bonded the substrate 112; a first gain chip 104-1, a second gain chip 104-2, a third gain chip 104-3, and a fourth gain chip 104-4. Four modulator chips 108 are bonded the substrate 112; a first modulator chip 108-1, a second modulator chip 108-2, a third modulator chip 108-3, and a fourth modulator chip 108-4.

Waveguides 130 are integrated on the substrate 112 (e.g., in the device layer of the SOI wafer). Reflectors 140 are integrated on the substrate 112 (e.g., Bragg gratings in the device layer of the SOI wafer). Ridges 142 are formed on the gain chips 104 and/or the modulator chips 108 to guide light transmitted through the gain chips 104 and/or the modulator chips 108. In some embodiments, more than one ridge 142 is formed on each gain chip 104 and/or modulator chip 108. In the embodiment shown, there are four ridges 142 formed on each gain chip 104 and modulator chip 108.

Reflectors 140 are integrated on the substrate to be on two sides of a gain chip 104. In some embodiments, a mirror is formed in the gain chip 104. Two reflectors 140, optically coupled with a ridge 142, form an optical resonator for a laser 144. In the embodiment shown, each gain chip 104 supports four lasers 144. Each modulator chip 108 modulates light received from four lasers 144.

In FIG. 1, there are sixteen lasers 144 and sixteen waveguides 130. Not all features are labeled in order to reduce clutter in the figures. The features will be clear to a person of ordinary skill in the art. For example, the third gain chip 104-3 comprises four ridges, yet the four ridges on the third gain chip are not labeled. But a person of ordinary skill comparing the ridges labeled "142" on the fourth gain chip 104-4 will understand that the third gain chip 104-3 also has four ridges 142. Similarly, a person of skill in the art will understand that there are four lasers 144, supported by the third gain chip 103-4, even though only one laser 144 is labeled in the figure.

The sixteen waveguides 130 route light from the sixteen lasers 144 to a multiplexer 160. The multiplexer 160 combines light from the sixteen lasers 144 to an optical output 164. In some embodiments, the optical output 164 comprises a crystalline silicon core. The optical output 164 is optically coupled with an optical fiber 168.

In some embodiments, one gain chip 104 is used for one laser 144. In some embodiments one gain chip 104 is used to support, two, three, five, or more lasers 144. In FIG. 1, there are eight chips: four gain chips 104 and four modulator chips 108. Each chip has four ridges 142 patterned on the chip. In some embodiments, only one, two, or three ridges 142, or more than four ridges 142, are patterned on each chip. In some embodiments, gain chips 104 have different bandgaps for different lasing frequencies.

In some embodiments, a 400 Gb/s transmitter has a single optical output 164 and four different wavelengths, each laser 144 transmitting at 100 Gb/s. There are four gain chips 104, and each gain chip 104 has only one ridge (thus each gain chip 104 supports only one laser 144). In some embodiments, a 400 Gb/s transmitter has a single optical output 164 and eight different wavelengths, eight lasers 144 transmitting at 50 Gb/s. There are four gain chips 104, and each gain chip 104 has two ridges (thus each gain chip 104 supports two lasers 144). In some embodiments, four gain chips 104 and four modulator chips 108 are integrated on the substrate 112 with the multiplexer 160, wherein each gain chip 104 supports 1, 2, or 4 lasers for 4, 8, or 16λ wavelength-division multiplexing (WDM) and each modulator chip 108 supports 1, 2, or 4 modulators for 4, 8, or 16λ WDM.

In some embodiments, for WDM over an 80 nm wavelength span and temperature range from 0 degrees C. to 70 degrees C.:
  4 channels can be supported with 20 nm channel spacing.
    20 nm channel spacing doesn't use multiplexer 160 tuning or laser 144 wavelength tuning.
  8 channels can be supported with 10 nm channel spacing.
    10 nm channel spacing uses some multiplexer 160 tuning and/or some laser 144 wavelength tuning.
  16 channels can be supported with 5 nm channel spacing.
    5 nm channel spacing uses more multiplexer 160 tuning and/or laser 144 wavelength tuning than 10 nm channel spacing.

In some embodiments, the wavelength span for WDM can be greater than 80 nm by controlling temperature of the transmitter. In some embodiments, a temperature of the transmitter is controlled so that there can be less multiplexer 160 tuning and/or laser 144 wavelength tuning.

In some embodiments, gain chips 104 have different bandgaps to produce different wavelength ranges for lasers. In some embodiments, modulator chips 108 have different bandgaps. In some embodiments, an echelle grating is used for the multiplexer 160.

In some embodiments, pulse-amplitude modulation (PAM) is used (e.g., with two levels). In some embodiments, PAM with more than two levels is used (e.g., PAM4; having four levels and/or not returning to zero for each pulse). Having more than two levels is used to reduce a baud rate for each wavelength. One tradeoff of using PAM4 techniques is that PAM4 techniques are more susceptible to noise than binary pulse-amplitude modulation.

Figure 2:
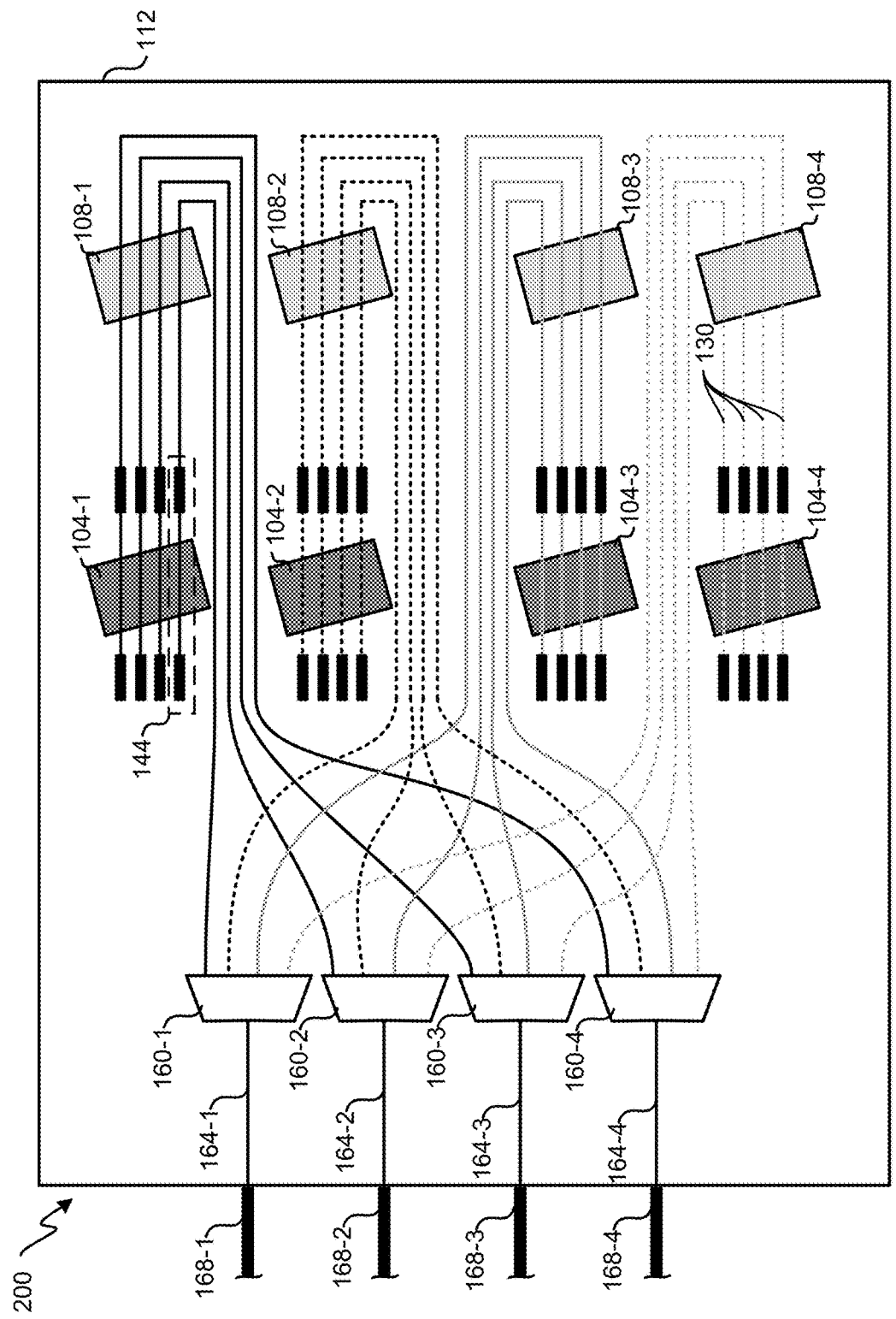
FIG. 2 depicts a simplified top view of an embodiment of a second transmitter.

In FIG. 2, an embodiment of a second transmitter 200 is shown. The second transmitter 200 is similar to the sixteen-wavelength transmitter 100, except instead of having one multiplexer 160, the second transmitter 200 comprises four multiplexers 160 and four optical outputs 164 coupled with four optical fibers 168. The second transmitter 200 comprises a first multiplexer 160-1, a second multiplexer 160-2, a third multiplexer 160-3, and a fourth multiplexer 160-4. The second transmitter 200 comprises a first optical output 164-1, a second optical output 164-2, a third optical output 164-3, and a fourth optical output 164-4. Each multiplexer 160 in FIG. 2 receives four optical inputs and combines those four optical inputs into an optical output 164. One optical input to the multiplexer 160 comes from each of the gain chips 104. For example, the first multiplexer 160-1 receives on optical input from a waveguide 130 coupling light from the first gain chip 104-1; the first multiplexer 160-1 receives on optical input from a waveguide 130 coupling light from the second gain chip 104-2; the first multiplexer 160-1 receives on optical input from a waveguide 130 coupling light from the third gain chip 104-3; and the first multiplexer 160-1 receives on optical input from a waveguide 130 coupling light from the fourth gain chip 104-4. The first multiplexer 160-1 combines light from four inputs to the first optical output 164-1. The first optical output 164-1 transmits the light combined from the first multiplexer 160-1 to the first optical fiber 168-1. The second multiplexer 160-2 receives four inputs, one from each of the gain chips 104, combines the four inputs to the second optical output 164-2, for transmission to the second optical fiber 168-2. The third multiplexer 160-3 receives four inputs, one from each of the gain chips 104, combines the four inputs to the third optical output 164-3, for transmission to the third optical fiber 168-3. The fourth multiplexer 160-4 receives four inputs, one from each of the gain chips 104, combines the four inputs to the fourth optical output 164-4, for transmission to the fourth optical fiber 168-4.

Thus the second transmitter 200 generates four output beams, each output beam with four different wavelengths. Each laser 144 is modulated at 25 Gb/s. In some embodiments, modulation is plus or minus 30%, 20%, 10%, and/or 5% of a rate. Thus each optical output 164 transmits at 100 Gb/s, and the second transmitter 200 transmits at 400 Gb/s. In some embodiments, the second transmitter 200 is for reverse compatibility with 100 Gb/s systems. In some embodiments, the second transmitter 200 can communicate with a 100 G course wavelength division multiplexing (CWDM) module by breaking the 400 G signal into four lanes of 100 G signal (e.g., by using a breakout cable).

In FIG. 2, lines representing waveguides 130 are coded for different wavelengths. Waveguides 130 that are black and solid represent a first wavelength of light being transmitted. Waveguides 130 that are black and dashed represent a second wavelength of light being transmitted. Waveguides 130 that are gray and solid represent a third wavelength of light being transmitted. Waveguides 130 that are gray and dashed represent a fourth wavelength of light being transmitted. In some embodiments, a multiplexer 160 combines more than one waveguide 130 from a modulator chip 108.

The second transmitter 200 uses WDM over a wavelength span of 80 nm. The second transmitter 200 can be used in a temperature range from 0 degrees C. to 70 degrees C. without tuning lasers 144 and/or multiplexers 160. In some embodiments, the second transmitter uses 20 nm channel spacing. In some embodiments, channel spacing is plus or minus 30%, 20%, 10% and/or 5% of the channel spacing. For example, the 20 nm channel spacing of the second transmitter is 20 nm plus or minus 6 nm, 4 nm, 2 nm, and/or 1 nm. The gain chips 104, the modulator chips 108, the waveguides 130, and the multiplexers 160 are integrated (e.g., monolithically) on the substrate 112, wherein the substrate 112 is silicon. Each gain chip 104 covers a different wavelength band (e.g., having different bandgaps). Similarly, each modulator chip 108 covers a different wavelength band from other modulator chips 108.

Figure 3:
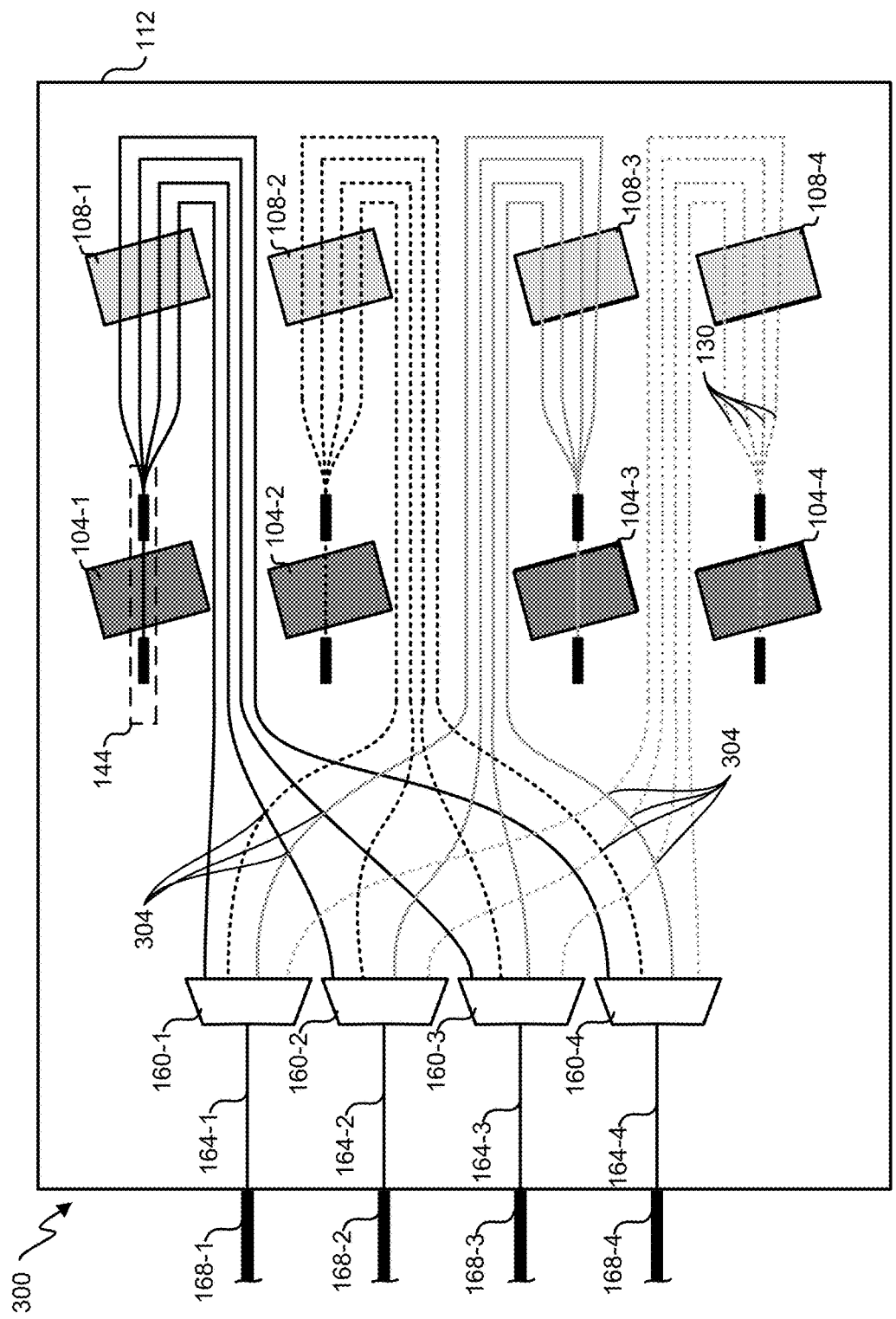
FIG. 3 depicts a simplified top view of an embodiment of a third transmitter.

In FIG. 3, an embodiment of a third transmitter 300 is shown. The third transmitter 300 is similar to the second transmitter 200, except instead of having four lasers 144 per gain chip 104, the third transmitter 300 has one laser 144 per gain chip 104, each of which is split into four waveguides 130 before transmission to a modulator chip 108. Other configurations are possible. For example, in some embodiments there are two lasers 144 per gain chip 104, which are each split into two waveguides 130 before the modulator chip 108. In some embodiments, there are four lasers 144 per gain chip 104 and only two ridges 124 or one ridge 124 per modulator chip 108 (less ridges 124 per modulator chip 108 than gain chip 104; thus there are more modulator chips 108 than gain chips 104 on the substrate 112). Other numbers of ridges 124 (e.g., 3, 5, 6, 8, 12, etc.) can be made on chips based on a size of a chip and sizes of ridges 124 and waveguides 130.

Figure 4:
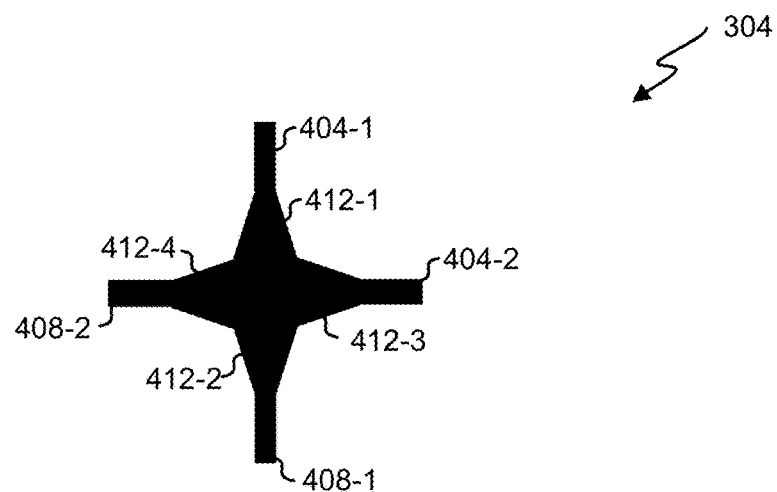
FIG. 4 depicts a simplified top view of an embodiment of a crossing for waveguides.

In FIGS. 2 and 3, waveguides 130 intersect at crossings 304 to route to the multiplexers 160. In FIG. 4, an embodiment of a crossing 304 is shown. The crossing 304 has a first input 404-1, a second input 404-2, a first output 408-1, and a second output 408-1. A first optical beam propagates from the first input 404-1 to the first output 408-1. A second optical beam propagates from the second input 404-2 to the second output 408-2.

The first input 404-1 comprises a first taper 412-1, an expanding taper, to expand an optical mode of the first optical beam. The first output 408-1 comprises a second taper 412-2, a narrowing taper, to constrict an optical mode of the first optical beam. The second input 404-2 comprises a third taper 412-3, an expanding taper, to expand an optical mode of the second optical beam. The second output 408-2 comprises a fourth taper 412-4, a narrowing taper, to constrict an optical mode of the second optical beam. The first taper 412-1, the second taper 412-2, the third taper 412-3, and the fourth taper 412-4, widen into each other in a direction toward a center of the crossing 304. Thus two waveguides 130 cross each other. In some embodiments, two waveguides 130 cross each other perpendicularly.

Figure 5:
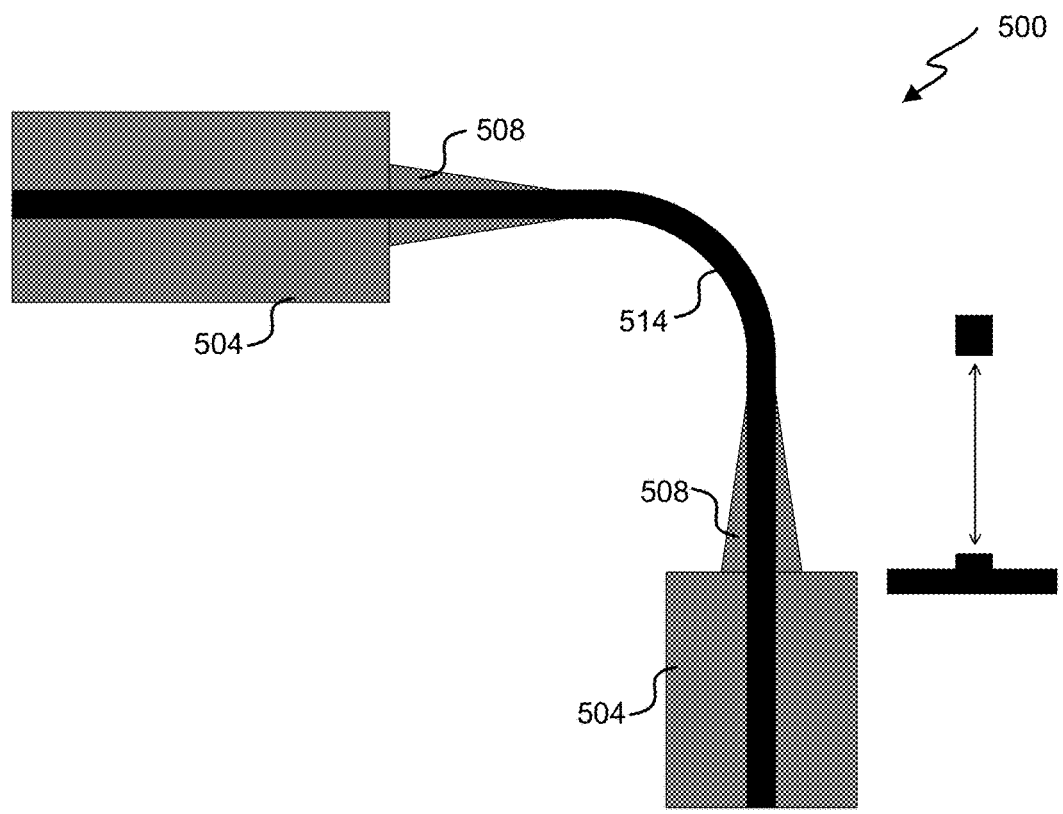
FIG. 5 depicts a an embodiment of a sharp bend for waveguides.

Referring next to FIG. 5, an embodiment of a sharp bend 500 is shown. The modulator chips 108 are connected to high-speed drivers. Sharp bends 500 in waveguides 130 can be used for dense optical routing. Modulator chips 108 are on opposite sides of the substrate 112 than optical outputs 164. In some embodiments, sharp bends 500 are used so that modulator chips 108 can be positioned near an edge of the substrate 112 so that high-speed drivers can be electrically connected with the modulator chips 108.

In some embodiments, two 90-degree turns are used (e.g., to guide light from a modulator chip 108 to a multiplexer 160. In some embodiments, one turn (e.g., a continuous curvature bend) is used to turn waveguides 130 through 180 degrees. In some embodiments, the sharp bend 500 has a radius of curvature less than 50 µm. In some embodiments, the sharp bend 500 is used for large-core waveguides (waveguides having a thickness greater than 1 µm).

Shallow-etched ridge waveguides 504 are used to maintain single-mode operation. Before bending, an adiabatic taper 508 converts the shallow-etched ridge waveguide 504 to a deep-etched channel waveguide 514. The adiabatic taper 508 minimizes exciting higher-order modes (higher than a fundamental mode) in the deep-etched channel waveguide 514. A continuous-curvature (CC) bend with small radius (radius <50 µm) is used to make a 90-degree waveguide turn in the deep-etched channel waveguide 514. The CC bend is made with a deep-etched channel waveguide 514 to reduce radiation loss. The CC bend's curvature starts from zero, which reduces coupling loss with the adiabatic taper 508. Then the CC bend's curvature gradually increases to maximum at a midpoint of the bend; then it gradually decreases to zero for coupling with an adiabatic taper 508. The adiabatic changing of the CC bend's curvature can be linear, or with different orders of non-linearity, depending on the design.

Figure 6:
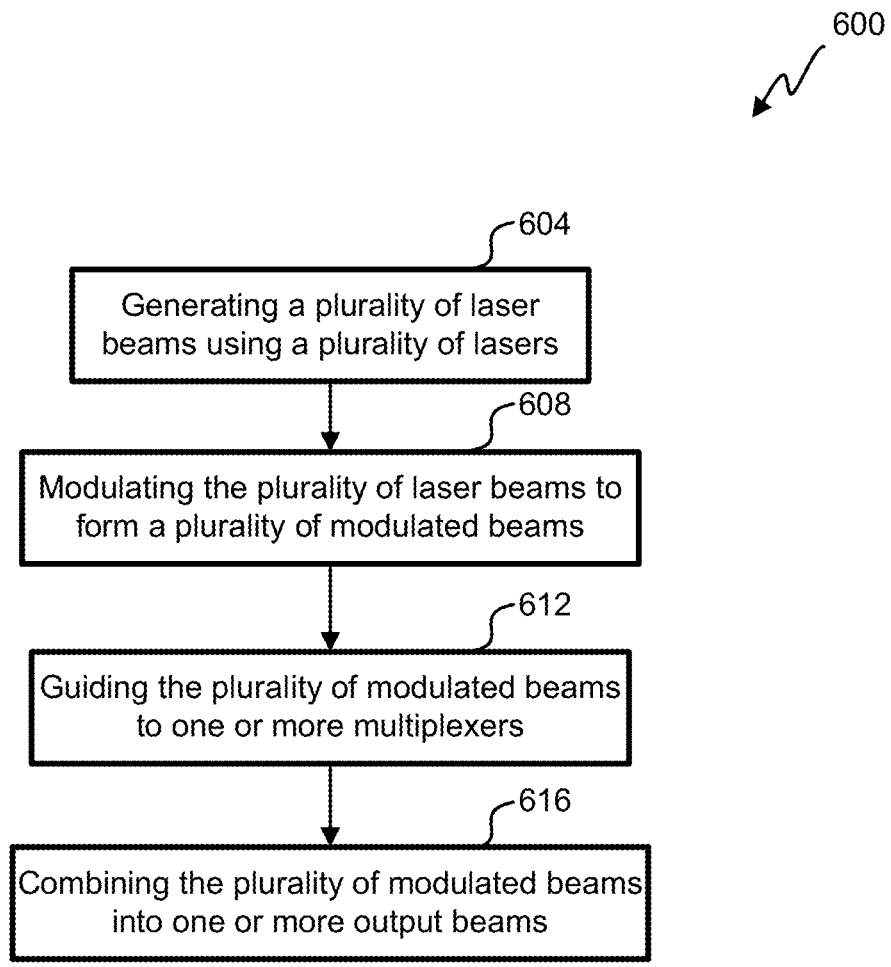
FIG. 6 illustrates a flowchart of an embodiment of a process for operating an optical transmitter.

FIG. 6 illustrates a flowchart of an embodiment of a process 600 for operating an optical transmitter. Process 600 begins in step 604 with generating a plurality of laser beams using a plurality of lasers 144. The plurality of lasers 144 are integrated on the substrate 112. Generating the plurality of laser beams comprises applying electrical power the plurality of gain chips 104.

In step 608, the plurality of laser beams are modulated to form a plurality of modulated beams. The plurality of laser beams are modulated using the modulator chips 108. In some embodiments, modulating the plurality of laser beams comprises using a pulse-amplitude modulation (PAM) technique having more than two levels (e.g., 3, 4, 5, or 6 levels; in some embodiments, less than 5, 6, 8, or 10 levels). In some embodiments the pulse-amplitude modulation technique used is PAM4.

In step 612, the plurality of modulated beams are guided to one or more multiplexers 160 using a plurality of waveguides 130. In step 616, the modulated beams are combined into one or more output beams using the one or more multiplexers 160. Each output beam is guided by an optical output 164 to an optical fiber 168.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of exemplary embodiments of the invention has been presented for the purposes of illustration and description. The embodiments were chosen and described in order to explain the principles of the invention and its practical applications to enable others skilled in the art to utilize the invention in various embodiments and with various modifications as are suited to the particular use contemplated. It is not intended to be exhaustive or to limit the invention to the precise form described, and many modifications and variations are possible in light of the teaching above. For example, the embodiments shown can be scaled up or down. A transmitter with one gain chip with four ridges (for four lasers), a modulator with four ridges, four waveguides, one multiplexer, and one optical output 164 could be integrated the substrate to form a 100 Gb/s transmitter, with the four lasers being modulated at 25 Gb/s each. Or there could be two, three, five, or more 100 Gb/s transmitters integrated on the substrate 112. Integrating techniques disclosed in other applications concurrently filed with this application are also envisioned. For example, instead of two reflectors 140 formed external to the gain chip 104, a reflector 140 can be formed in the gain chip 104 as disclosed in the '___application, entitled "Broadband Back Mirror for a III-V Chip in Silicon Photonics."

It is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. An optical transmitter using semiconductor lasers and wavelength-division multiplexing (WDM), the optical transmitter comprising:
    a substrate, wherein the substrate is silicon;
    four gain chips integrated on the substrate;
    a plurality of reflectors integrated on the substrate, wherein:
        the four gain chips and the plurality of reflectors form a plurality of lasers integrated on the substrate;
        there are four lasers per gain chip;
        the plurality of lasers are configured to transmit on predetermined optical channels of a WDM protocol; and
        each laser per gain chip operates on the same predetermined optical channel of the WDM protocol;
    four modulator chips integrated on the substrate, wherein the four modulator chips modulate light generated by the plurality of lasers;
    sixteen waveguides integrated on the substrate configured to guide light from the four modulator chips to four multiplexers, wherein each of the four modulator chips is optically coupled with four waveguides of the sixteen waveguides;
    the four multiplexers, wherein:
        the four multiplexers are integrated on the substrate; and
        each of the four multiplexers is configured to receive light from four waveguides of the sixteen waveguides and combine the light from the four waveguides into an optical output; and
    four optical outputs, wherein:
        the four optical outputs are integrated on the substrate;
        there is one optical output for each of the four multiplexers; and
        each of the four optical outputs is configured to transmit light of four different frequencies to an optical fiber.

2. The optical transmitter of claim 1, wherein each gain chip, of the four gain chips, has a different bandgap.

3. The optical transmitter of claim 1, wherein the four gain chips comprise III-V material.

4. The optical transmitter of claim 1, wherein:
    the substrate is part of a silicon-on-insulator (SOI) wafer;
    the SOI wafer comprises a device layer of crystalline silicon; and
    the sixteen waveguides are formed in the device layer.

5. The optical transmitter of claim 1, wherein the modulator chips modulate each of the plurality of lasers to produce a plurality of optical beams each optical beam of the plurality of optical beams modulated at 25 Gb/s plus or minus 20%.

6. An optical transmitter using semiconductor lasers and wavelength-division multiplexing (WDM), the optical transmitter comprising:
    a substrate, wherein the substrate is silicon;
    four gain chips integrated on the substrate, wherein there is one laser per gain chip;
    a plurality of reflectors integrated on the substrate, wherein:
        the four gain chips and the plurality of reflectors form a plurality of lasers integrated on the substrate; and
        the plurality of lasers are configured to transmit on predetermined optical channels of a WDM protocol;
    four modulator chips integrated on the substrate, wherein the four modulator chips modulate light generated by the plurality of lasers and each modulator chip has four ridges to produce four modulated signals;
    sixteen waveguides integrated on the substrate configured to guide light from the four modulator chips to four multiplexers;
    the four multiplexers, wherein:
        the four multiplexers are integrated on the substrate; and
        each of the four multiplexers is configured to receive light from four waveguides of the sixteen waveguides and combine the light from the four waveguides into an optical output; and
    four optical outputs, wherein:
        the four optical outputs are integrated on the substrate;
        there is one optical output for each of the four multiplexers; and
        each of the four optical outputs is configured to transmit light of four different frequencies to an optical fiber.

* * * * *